United States Patent
Abe

(10) Patent No.: US 10,083,857 B2
(45) Date of Patent: Sep. 25, 2018

(54) METHOD FOR MANUFACTURING SEMICONDUCTOR DEVICE WITH TRENCH ISOLATION STRUCTURE HAVING PLURAL OXIDE FILMS

(71) Applicant: Renesas Electronics Corporation, Koutou-ku, Tokyo (JP)

(72) Inventor: Takayuki Abe, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/469,500

(22) Filed: Mar. 25, 2017

(65) Prior Publication Data

US 2017/0287774 A1    Oct. 5, 2017

(30) Foreign Application Priority Data

Mar. 29, 2016 (JP) .................. 2016-065730

(51) Int. Cl.
| | |
|---|---|
| *H01L 21/768* | (2006.01) |
| *H01L 21/762* | (2006.01) |
| *H01L 23/522* | (2006.01) |
| *H01L 21/02* | (2006.01) |
| *H01L 29/06* | (2006.01) |
| *H01L 23/532* | (2006.01) |
| *H01L 27/06* | (2006.01) |

(52) U.S. Cl.
CPC .. *H01L 21/76805* (2013.01); *H01L 21/02164* (2013.01); *H01L 21/02238* (2013.01); *H01L 21/02255* (2013.01); *H01L 21/02271* (2013.01); *H01L 21/76237* (2013.01); *H01L 21/76814* (2013.01); *H01L 23/5226* (2013.01); *H01L 23/5329* (2013.01); *H01L 29/0649* (2013.01); *H01L 21/02274* (2013.01); *H01L 27/0635* (2013.01)

(58) Field of Classification Search
CPC ......... H01L 21/76805; H01L 21/02164; H01L 21/02238; H01L 21/02255; H01L 21/02271; H01L 21/76237; H01L 21/76814; H01L 21/02274; H01L 21/823481; H01L 23/5226; H01L 23/5329
See application file for complete search history.

(56) References Cited

U.S. PATENT DOCUMENTS 5,356,836 A * 10/1994 Chen .................. H01L 21/743
                                                                204/192.17
2011/0073944 A1* 3/2011 Tsukihara ......... H01L 21/76224
                                                                257/337

FOREIGN PATENT DOCUMENTS

| JP | 2000-269317 A | 9/2000 |
|---|---|---|
| JP | 2011-071304 A | 4/2011 |

\* cited by examiner

*Primary Examiner* — Tucker J Wright
(74) *Attorney, Agent, or Firm* — Shapiro, Gabor and Rosenberger, PLLC

(57) ABSTRACT

A first silicon oxide film is formed on the inner wall of a deep trench by oxidizing the inner wall of the deep trench while heating the inner wall. Then, a second silicon oxide film is formed using at least one of atmospheric pressure CVD and plasma CVD so that the second silicon oxide film covers the first silicon oxide film in the deep trench.

5 Claims, 8 Drawing Sheets

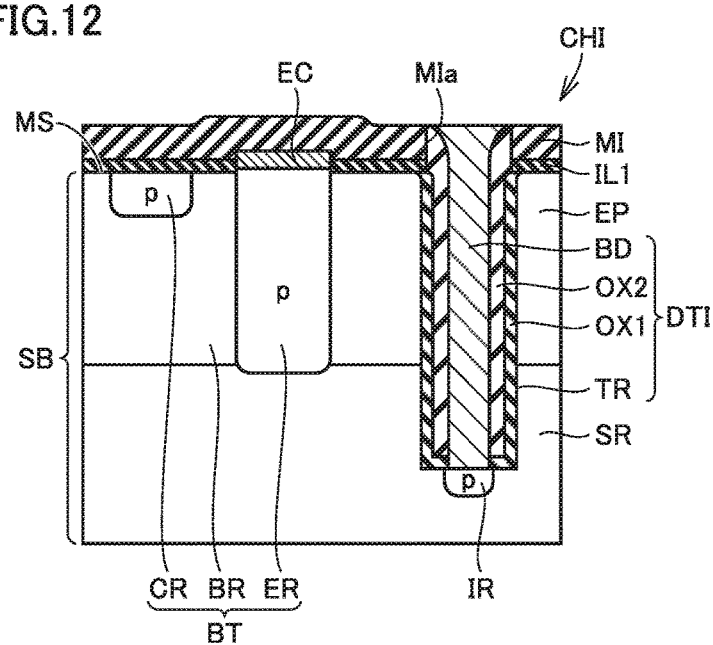
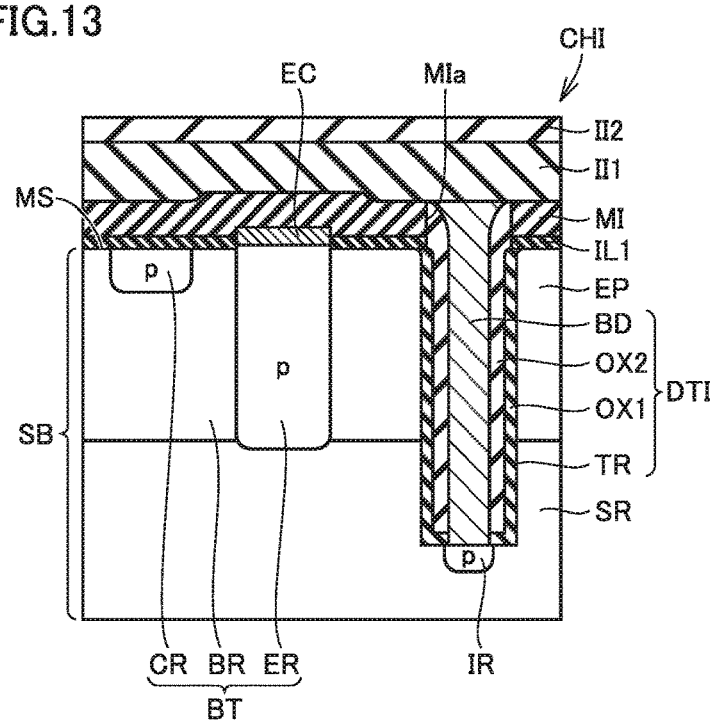

ND FOR MANUFACTURING SEMICONDUCTOR DEVICE WITH TRENCH ISOLATION STRUCTURE HAVING PLURAL OXIDE FILMS

This nonprovisional application is based on Japanese Patent Application No. 2016-065730 filed on Mar. 29, 2016 with the Japan Patent Office, the entire contents of which are hereby incorporated by reference.

BACKGROUND OF THE INVENTION

Field of the Invention

The present invention relates to a semiconductor device and a method for manufacturing the same.

Description of the Background Art

A technique using a deep trench isolation (DTI) structure has been heretofore known as a method of isolation for a semiconductor device. In the isolation method, an insulating film is formed on the inner surface of a deep trench for the DTI structure to have an isolation function.

Semiconductor devices including such a DTI structure are described in, for example, Japanese Patent Laying-Open Nos. 2000-269317 and 2011-71304. In these two documents, an oxide film is formed on the sidewall of a deep trench using an oxidation technology, and then a tetra ethyl ortho silicate (TEOS) oxide film is formed using a low pressure-chemical vapor deposition (LP-CVD) technology.

SUMMARY OF THE INVENTION

However, in the DTI structure described in the above-mentioned documents, the oxide film to be formed in the deep trench varies in thickness if a pattern density of deep trench varies depending on the product. Specifically, in the case of a high pattern density of the deep trench, the oxide film in the deep trench would be thin; while in the case of a low pattern density of the deep trench, the oxide film in the deep trench would be thick. A thin oxide film in the deep trench may not satisfy a dielectric strength voltage required for the DTI structure. On the other hand, a thick oxide film in the deep trench may deteriorate the burying properties of a conductive layer buried in the deep trench.

Other objects and novel features will become more apparent from the description of the present specification and the accompanying drawings.

According to a method for manufacturing a semiconductor device in an embodiment, a first silicon oxide film is formed on the inner wall of a trench by oxidizing the inner wall of the trench while heating the inner wall. Then, a second silicon oxide film is formed using at least one of atmospheric pressure CVD and plasma CVD so that the second silicon oxide film covers the first silicon oxide film in the trench.

According to a semiconductor device in an embodiment, the first silicon oxide film includes a first portion along the sidewall of the trench and a second portion along the bottom wall of the trench, the second portion being bent with respect to the first portion. The second silicon oxide film is disposed on the second portion.

According to the embodiment, a variation in thickness of the oxide film formed in the deep trench can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 12 is a schematic cross-sectional view showing a ninth step of a method for manufacturing a semiconductor device in an embodiment.

FIG. 13 is a schematic cross-sectional view showing a tenth step of a method for manufacturing a semiconductor device in an embodiment.

DESCRIPTION OF THE PREFERRED EMBODIMENTS

An embodiment is described below with reference to the drawings.

Figure 1:
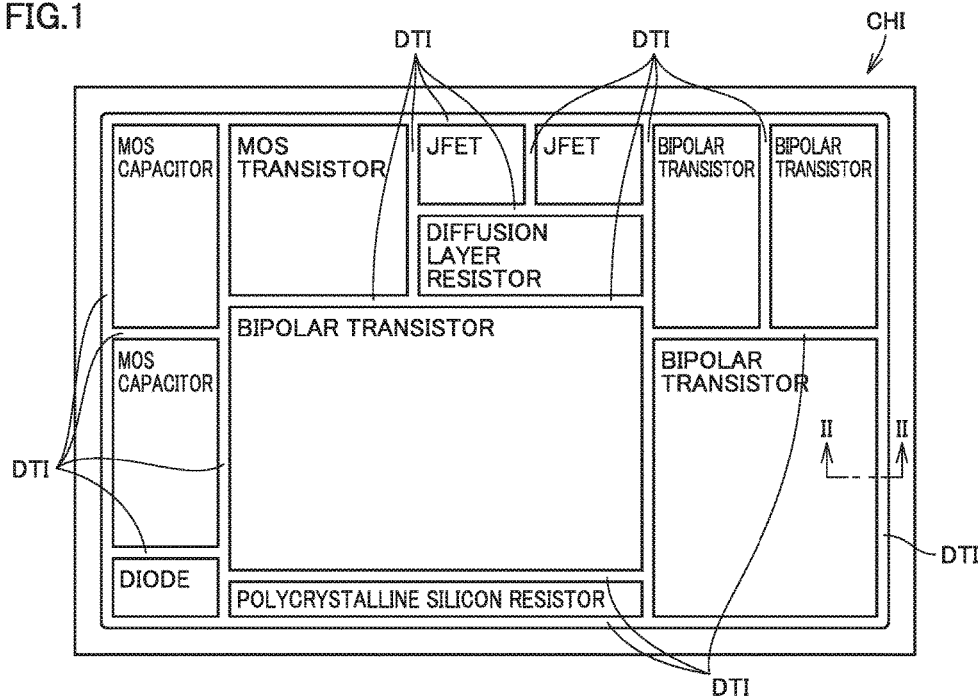
FIG. 1 is a plan view schematically showing a configuration of a semiconductor device in an embodiment.

As shown in FIG. 1, a semiconductor device CHI in this embodiment is in the form of a chip and includes a semiconductor substrate. In a surface of the semiconductor substrate, formation regions where components are formed are arranged, the components including bipolar transistors, a metal oxide semiconductor (MOS) transistor, MOS capacitors, a diode, junction field effect transistors (JFETs), a diffusion layer resistor, and a polycrystalline silicon resistor.

Each of these formation regions is individually surrounded by a DTI structure in a plan view (as viewed in the direction perpendicular to the surface of the semiconductor substrate). The DTI structure thus electrically isolates the formation regions from one another.

Figure 2:
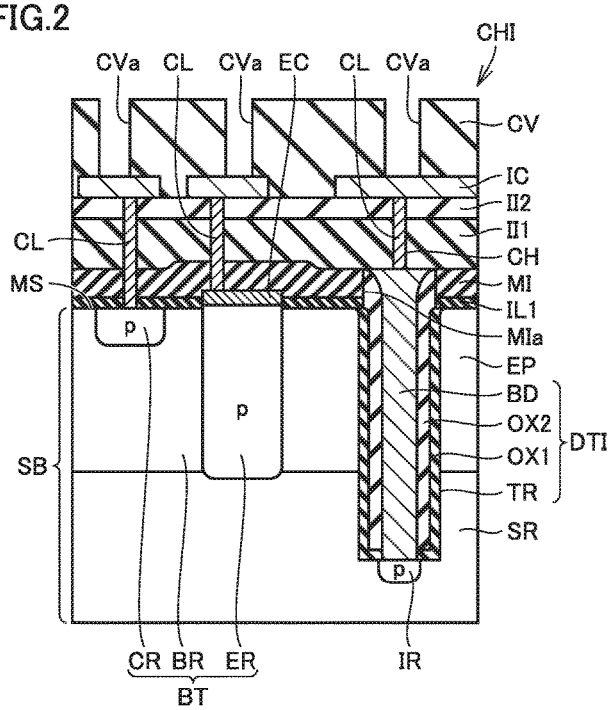
FIG. 2 is a schematic cross-sectional view taken along the line II-II of FIG. 1.

As shown in FIG. 2, semiconductor device CHI mainly includes a semiconductor substrate SB, elements (for example, a bipolar transistor BT) formed in semiconductor substrate SB, and a DTI structure DTI electrically isolating the elements from one another.

Semiconductor substrate SB includes a p-type substrate region SR. Semiconductor substrate SB includes an n-type epitaxial region EP located on the side adjacent to a surface MS with respect to substrate region SR. At the formation region of bipolar transistor BT, bipolar transistor BT is formed in semiconductor substrate SB.

Bipolar transistor BT includes a p-type collector region CR, an n-type base region BR, and a p-type emitter region ER. Base region BR is constituted of epitaxial region EP.

Collector region CR is formed in the surface of semiconductor substrate SB. The bottom portion and the side portion of collector region CR are in contact with epitaxial region EP (base region BR). Collector region CR thus forms a p-n junction together with base region BR.

Emitter region ER is formed so that it extends from surface MS of semiconductor substrate SB through epitaxial region EP (base region BR) to substrate region SR. Emitter region ER thus forms a p-n junction together with base region BR. In this way, collector region CR, base region BR, and emitter region ER constitute a pnp bipolar transistor BT.

On surface MS of semiconductor substrate SB, an emitter electrode EC is formed. Emitter electrode EC is in contact with emitter region ER. On surface MS of semiconductor substrate SB except the portion of emitter electrode EC, an insulating film IL1 is formed. This insulating film IL1 is, for example, a silicon oxide film.

An interlayer insulating film MI is formed so as to cover components including emitter electrode EC and insulating film IL1. Interlayer insulating film MI is made of, for example, a silicon oxide film. Insulating films IL1 and MI described above have an opening MIa. This opening MIa is located immediately above DTI structure DTI.

In order to electrically isolate the above-described bipolar transistor BT from other elements, semiconductor substrate SB has a DTI structure. As shown in FIG. 1, the DTI structure is formed so as to surround the formation region of bipolar transistor BT in surface MS of semiconductor substrate SB.

As shown in FIG. 2, the DTI structure includes a deep trench (trench) TR, first and second silicon oxide films OX1 and OX2, and a buried conductive layer BD.

Deep trench TR is formed in surface MS of semiconductor substrate SB. Deep trench TR extends from surface MS through epitaxial region EP to substrate region SR.

First silicon oxide film OX1 is a thermally oxidized film which is formed by thermal oxidation. First silicon oxide film OX1 is formed so as to be in contact with the inner wall (sidewall and bottom wall) of deep trench TR. Specifically, deep trench TR is in contact with semiconductor substrate SB at the sidewall of deep trench TR over the entire length of deep trench TR, from surface MS to the bottom wall of deep trench TR. First silicon oxide film OX1 is in contact with semiconductor substrate SB at the bottom wall of deep trench TR, and a portion of semiconductor substrate SB (substrate region SR) is exposed through first silicon oxide film OX1.

Second silicon oxide film OX2 is a CVD oxide film which is formed by at least one of plasma CVD and atmospheric pressure CVD. Second silicon oxide film OX2 extends from the upper surface of insulating film MI to the bottom wall of deep trench TR. Second silicon oxide film OX2 is in contact with both insulating film IL1 and insulating film MI in opening MIa in insulating films IL1 and MI. Also, second silicon oxide film OX2 is in contact with first silicon oxide film OX1 in deep trench TR. At the bottom wall of deep trench TR, a portion of semiconductor substrate SB (substrate region SR) is exposed through second silicon oxide film OX2.

Buried conductive layer BD is buried in deep trench TR. Buried conductive layer BD is made of, for example, metal, such as tungsten (W), or polycrystalline silicon with an impurity introduced therein (doped polycrystalline silicon). Buried conductive layer BD is in contact with the surface of second silicon oxide film OX2 in deep trench TR. At the bottom wall of deep trench TR, buried conductive layer BD is in contact with a portion of semiconductor substrate SB (substrate region SR) exposed through first and second silicon oxide films OX1 and OX2.

A p-type impurity region IR is formed at a portion of semiconductor substrate SB (substrate region SR) exposed through first and second silicon oxide films OX1 and OX2. This impurity region IR has a higher p-type impurity concentration than substrate region SR. Impurity region IR is in contact with buried conductive layer BD.

Over insulating film MI, interlayer insulating films II1 and II2 are formed. Interlayer insulating films II1 and II2 are each made of, for example, a silicon oxide film. Contact holes CH are formed that extend from the upper surface of interlayer insulating film II2 to collector region CR, emitter region ER, and buried conductive layer BD, respectively.

In these contact holes CH, respective contact conductive layers CL are buried. Contact conductive layers CL are made of, for example, tungsten. Interconnection layers IC are formed on interlayer insulating film II2 so that interconnection layers IC are in contact with contact conductive layers CL. Interconnection layers IC are made of, for example, aluminum (Al).

A cover film (passivation film) CV is formed over interlayer insulating film II2 so that cover film CV covers interconnection layers IC. Cover film CV is made of, for example, a silicon oxynitride (SiON) film. Cover film CV has openings CVa extending to a plurality of interconnection layers IC.

Next, a detailed configuration of the DTI structure is described with reference to FIG. 3.

Figure 3:
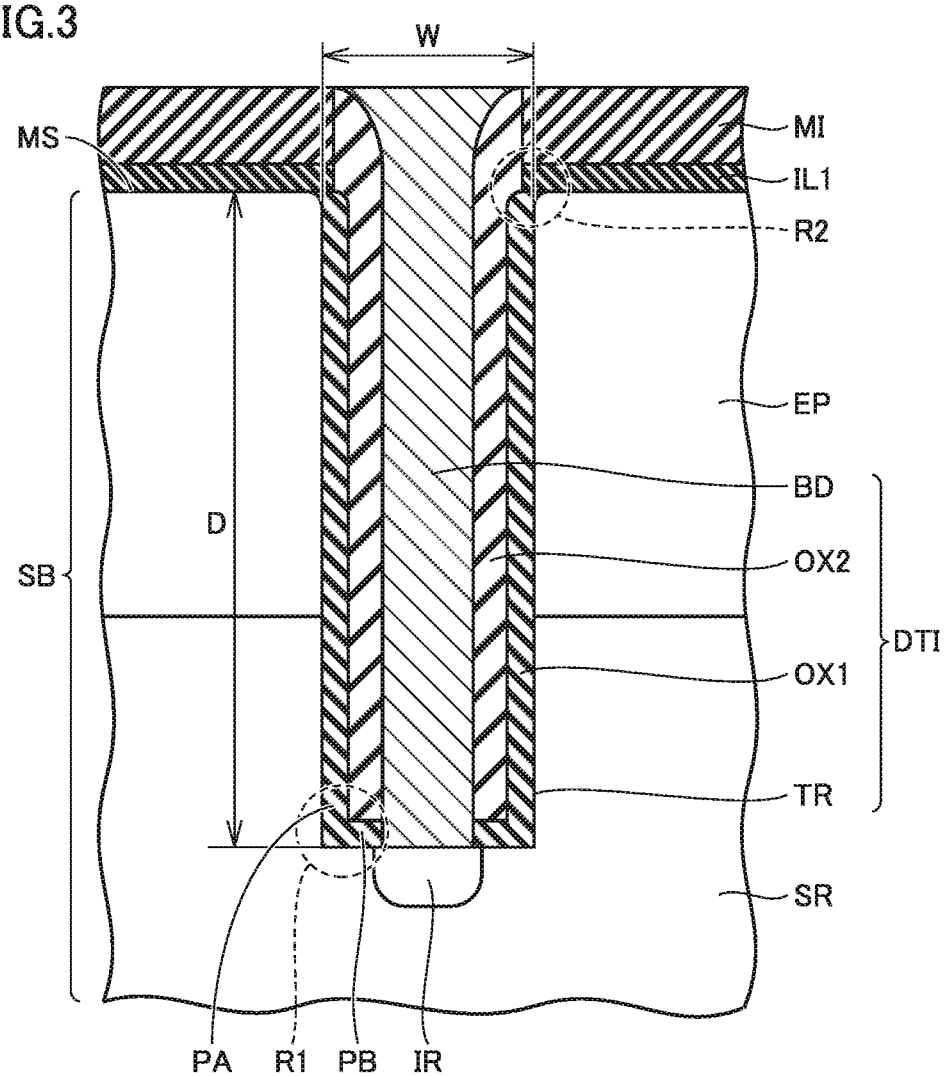
FIG. 3 is an enlarged cross-sectional view showing a deep trench and an area around the trench of FIG. 2.

As shown in FIG. 3, depth D of deep trench TR is preferably, for example, more than or equal to 3 μm, more preferably, for example, more than or equal to 10 μm, and still more preferably, for example, more than or equal to 12 μm and less than or equal to 16 μm.

The aspect ratio (depth D/width W) of deep trench TR is preferably more than or equal to 8 and less than or equal to 10. Here, depth D refers to a distance from surface MS of semiconductor substrate SB to the lower end of deep trench TR. Width W refers to the width of the upper end, except a round portion, of deep trench TR. Also, width W refers to the dimension in the direction perpendicular to the direction in which deep trench TR extends in a plan view shown in FIG. 1. The term "in a plan view" refers to a view as viewed in the direction perpendicular to surface MS of semiconductor substrate SB.

In a region R1 around the bottom wall of deep trench TR, a portion PB of first silicon oxide film OX1 in contact with the bottom surface of deep trench TR is bent in, for example, an L-shape, over the entire perimeter, with respect to a portion PA of first silicon oxide film OX1 in contact with the side surface of deep trench TR.

In the case in which the bottom wall of deep trench TR is bent as being curved with respect to the sidewall, portion PB of first silicon oxide film OX1 is accordingly bent as being curved with respect to portion PA over the entire perimeter.

Second silicon oxide film OX2 is formed so as to cover the bent portion of first silicon oxide film OX1. Thus, portion PB of first silicon oxide film OX1 in contact with the bottom surface of deep trench TR lies between the bottom wall of deep trench TR and second silicon oxide film OX2. Buried conductive layer BD is in contact with both first and second silicon oxide films OX1 and OX2.

In a region R2 of deep trench TR around surface MS, the corner portion of semiconductor substrate SB at the upper end of deep trench TR is in a round shape. This round shape is due to the fact that the silicon at the corner portion of semiconductor substrate SB has been oxidized by thermal oxidation for formation of second silicon oxide film OX2. Specifically, the corner of semiconductor substrate SB at the upper end of deep trench TR is rounded by being oxidized during thermal oxidation, thereby being formed into a round-shaped corner portion.

First silicon oxide film OX1 protrudes to the element formation region side relative to opening MIa in insulating films MI and IL1. This is because first silicon oxide film OX1 is formed by the silicon on the surface of semiconductor substrate SB being oxidized by thermal oxidation.

The boundary between first silicon oxide film OX1 and second silicon oxide film OX2 can be recognized.

Next, a method for manufacturing a semiconductor device in this embodiment is described with reference to FIG. 2 and FIGS. 4 to 14.

Figure 4:
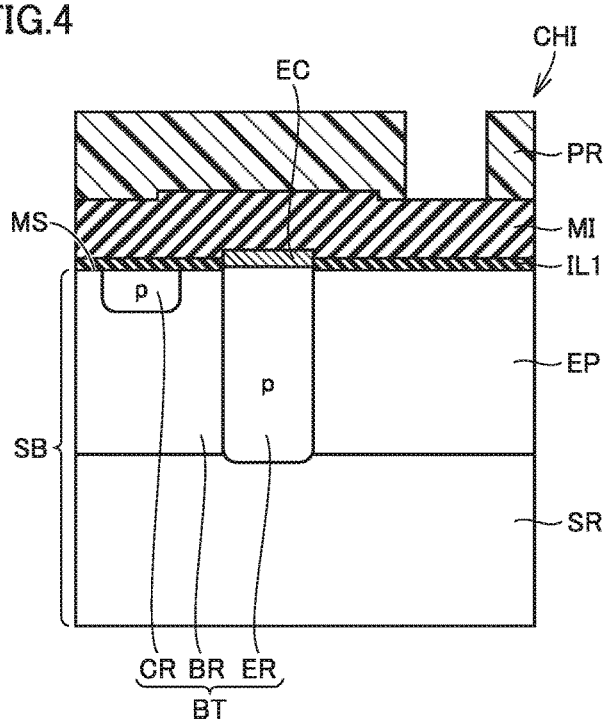
FIG. 4 is a schematic cross-sectional view showing a first step of a method for manufacturing a semiconductor device in an embodiment.

As shown in FIG. 4, bipolar transistor BT including collector region CR, base region BR, and emitter region ER is formed in semiconductor substrate SB. Insulating film IL1 is formed so as to cover surface MS of semiconductor substrate SB. Emitter electrode EC in contact with emitter region ER is formed through an opening in insulating film IL1.

Insulating film MI is formed over semiconductor substrate SB so that insulating film MI covers components including insulating film IL1 and emitter electrode EC. A photoresist PR is applied to insulating film MI and is then patterned by an exposure and a development. Insulating film MI is treated with dry etching using patterned photoresist PR as a mask. After the etching, photoresist PR is removed by, for example, ashing.

Figure 5:
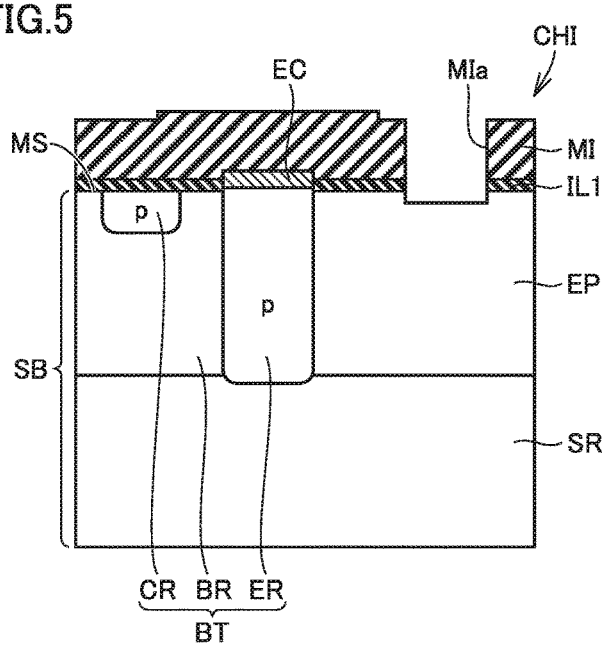
FIG. 5 is a schematic cross-sectional view showing a second step of a method for manufacturing a semiconductor device in an embodiment.

As shown in FIG. 5, opening MIa is formed in insulating film MI and insulating film IL1 by the above-described etching so that opening MIa extends through both insulating films MI and IL1 to surface MS of semiconductor substrate SB. A portion of semiconductor substrate SB is thus exposed through opening MIa.

Figure 6:
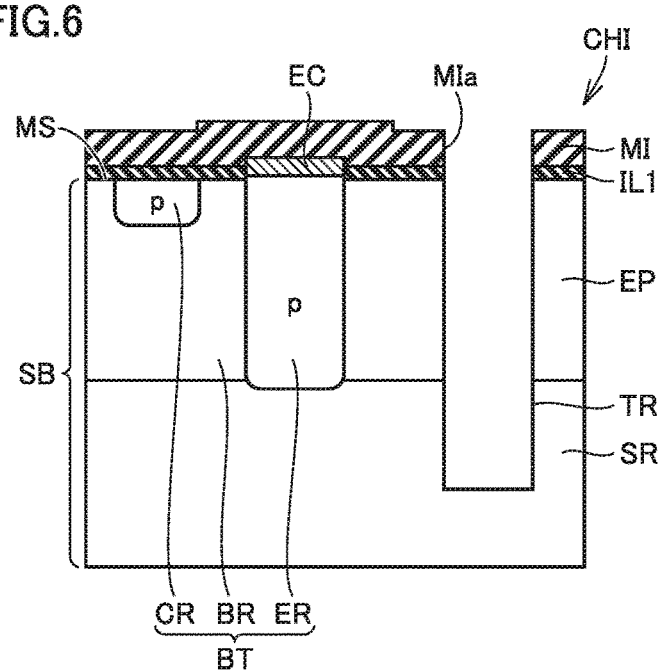
FIG. 6 is a schematic cross-sectional view showing a third step of a method for manufacturing a semiconductor device in an embodiment.

As shown in FIG. 6, the portion of semiconductor substrate SB exposed through opening MIa is treated with dry etching using insulating film MI as a hard mask. By this etching, deep trench TR is formed in semiconductor substrate SB so that deep trench TR extends from surface MS through epitaxial region EP into substrate region SR.

Figure 7:
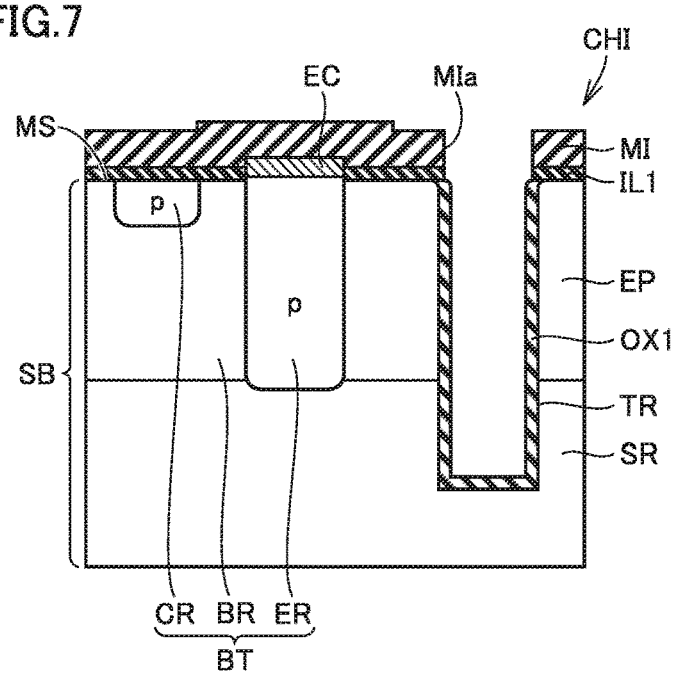
FIG. 7 is a schematic cross-sectional view showing a fourth step of a method for manufacturing a semiconductor device in an embodiment.

As shown in FIG. 7, semiconductor substrate SB is heated under an oxidizing atmosphere in an oxidation furnace. This thermally oxidizes the silicon of semiconductor substrate SB exposed at the inner wall of deep trench TR. By this thermal oxidation, silicon oxide film (thermally oxidized film) OX1 is formed on the inner wall of deep trench TR. First silicon oxide film OX1 is formed so as to have a thickness of, for example, more than or equal to 200 nm and less than or equal to 400 nm. At this time, the corner of semiconductor substrate SB at the upper end of deep trench TR is rounded by the thermal oxidation to form a round-shaped corner portion.

Figure 8:
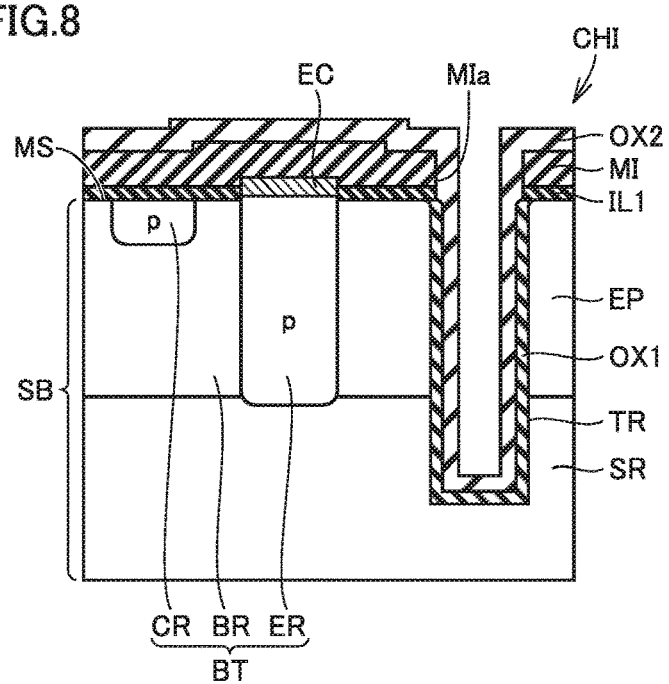
FIG. 8 is a schematic cross-sectional view showing a fifth step of a method for manufacturing a semiconductor device in an embodiment.

As shown in FIG. 8, second silicon oxide film (CVD oxide film) OX2 is formed by plasma CVD or atmospheric pressure CVD so that second silicon oxide film OX2 is in contact with the upper surface of insulating film MI. Second silicon oxide film OX2 is formed so as to have a thickness of, for example, more than or equal to 500 nm and less than or equal to 700 nm. Second silicon oxide film OX2 is formed so as to be in contact with first silicon oxide film OX1 in deep trench TR. Also, second silicon oxide film OX2 is formed so as to be in contact with both insulating films IL1 and MI in opening MIa.

Then, second silicon oxide film OX2 and first silicon oxide film OX1 are treated with anisotropic etching until a surface of semiconductor substrate SB is exposed at the bottom portion of deep trench TR.

Figure 9:
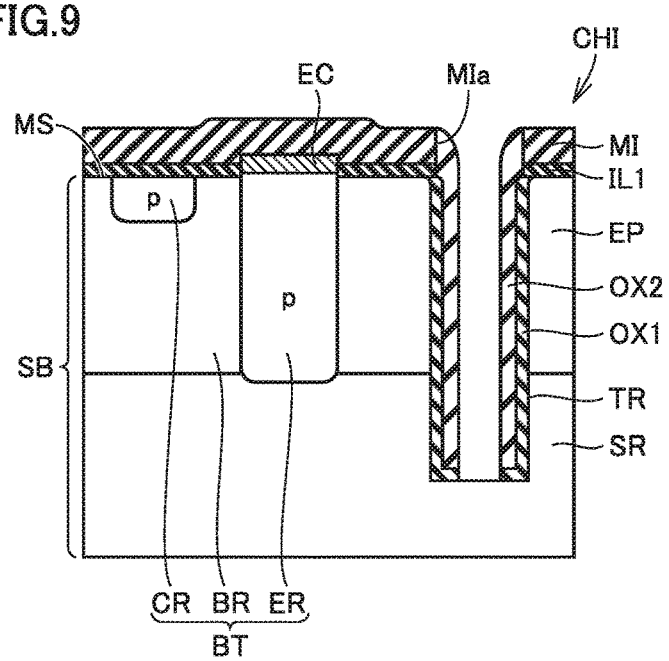
FIG. 9 is a schematic cross-sectional view showing a sixth step of a method for manufacturing a semiconductor device in an embodiment.

As shown in FIG. 9, the above-described etching causes the surface of semiconductor substrate SB to be exposed at the bottom portion of deep trench TR. This etching leaves first and second silicon oxide films OX1 and OX2 remaining on the sidewall of deep trench TR. Further, the etching removes second silicon oxide film OX2 on insulating film MI, and also removes a portion of insulating film MI.

Figure 10:
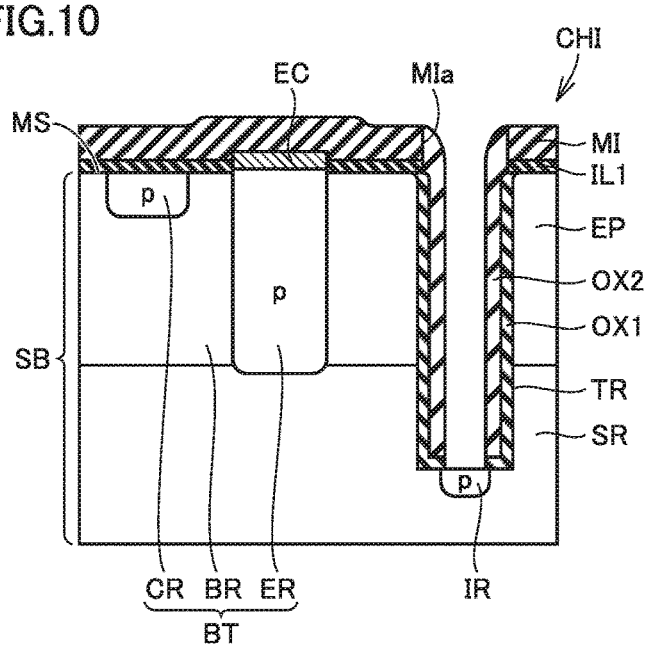
FIG. 10 is a schematic cross-sectional view showing a seventh step of a method for manufacturing a semiconductor device in an embodiment.

As shown in FIG. 10, ion implantation is performed, with a p-type impurity (for example, boron), into the surface of semiconductor substrate SB exposed at the bottom portion of deep trench TR. Thus, p-type impurity region IR is formed in the surface of semiconductor substrate SB exposed at the bottom portion of deep trench TR. P-type impurity region IR has a higher p-type impurity concentration than substrate region SR.

Figure 11:
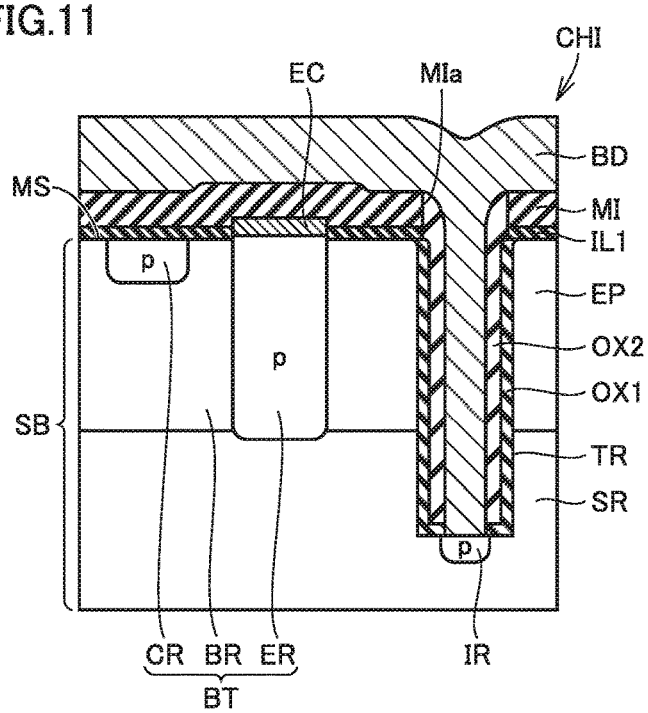
FIG. 11 is a schematic cross-sectional view showing an eighth step of a method for manufacturing a semiconductor device in an embodiment.

As shown in FIG. 11, conductive layer BD is formed on insulating film MI so as to be buried in deep trench TR. Conducting layer BD is formed with, for example, tungsten or doped polycrystalline silicon. Conductive layer BD is treated with chemical mechanical polishing (CMP) or dry etching.

As shown in FIG. 12, the CMP or the dry etching removes conductive layer BD by polishing so that conductive layer BD remains only in deep trench TR. Thus, buried conductive layer BD buried in deep trench TR is formed from conductive layer BD. This buried conductive layer BD is electrically connected to substrate region SR at the bottom portion of deep trench TR through impurity region IR.

As shown in FIG. 13, interlayer insulating film II1 and interlayer insulating film II2 are stacked in this order on components including insulating film MI and DTI structure DTI.

Figure 14:
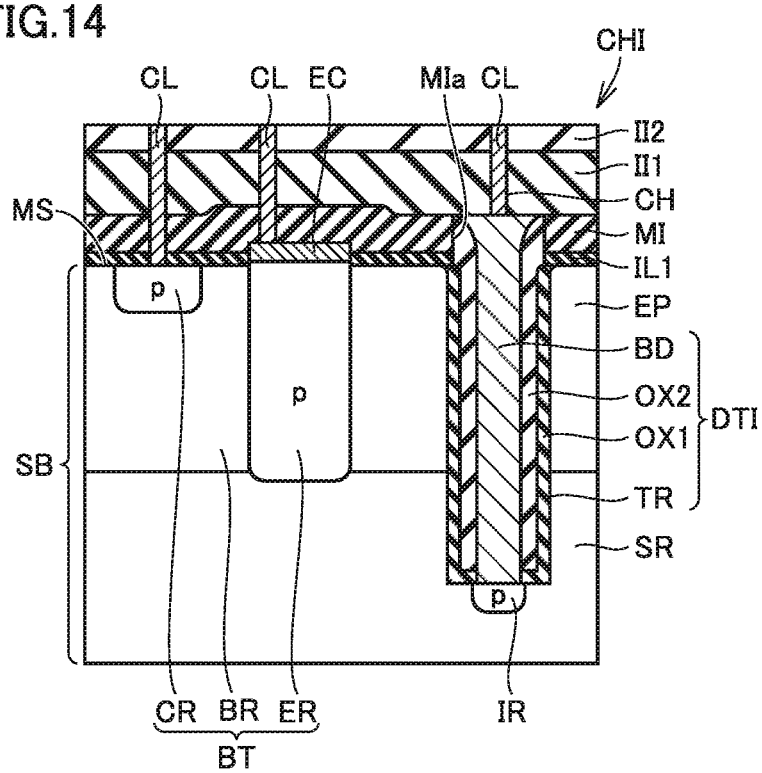
FIG. 14 is a schematic cross-sectional view showing an eleventh step of a method for manufacturing a semiconductor device in an embodiment.

As shown in FIG. 14, contact holes CH are formed using ordinary photolithography and etching so that contact holes CH extend from the upper surface of interlayer insulating film II2 to collector region CR, emitter region ER, and buried conductive layer BD, respectively. Conductive layers CL are formed so as to be buried in respective contact holes CH.

As shown in FIG. 2, interconnection layers IC are formed on interlayer insulating film II2 so that interconnection layers IC are electrically connected to conductive layers CL. Then, cover film CV is formed over interlayer insulating film II2 so that cover film CV covers interconnection layers IC. In this cover film CV, openings CVa are formed by ordinary photolithography and etching so that portions of interconnection layers IC are exposed. The semiconductor device in this embodiment is thus manufactured.

Next, the advantageous effects of this embodiment are described in comparison with conventional LP-CVD.

In conventional LP-CVD, deposition is performed at a small flow rate of deposition gas and with a low pressure, in general, to improve coatability of a silicon oxide film to be formed. Accordingly, an amount of deposition gas per wafer is smaller than in the case of other CVD methods and thus is largely dependent on the size of a wafer surface area.

For example, in the case of a large wafer surface area (in the case of a large trench pattern density), a large amount of deposition gas is required for forming a film on the whole wafer surface. Accordingly, a silicon oxide film to be formed will be thin if an amount of supplied deposition gas is not enough.

It is very difficult for mass-production factories to vary deposition conditions depending on the pattern density of each product because it would significantly lead to low productivity. Accordingly, a variation in pattern density of deep trench depending on the product causes a variation in thickness of oxide film to be formed in a deep trench. At a portion having a thin oxide film in a deep trench, therefore, a dielectric strength voltage required for a DTI structure may not be satisfied. On the other hand, at a portion having a thick oxide film in a deep trench, a conductive layer buried in the deep trench may have poor burying properties.

In contrast, according to the present embodiment, first silicon oxide film OX1 is formed on the inner wall of deep trench TR by oxidizing the inner wall while heating the inner wall in the step shown in FIG. 7. In thermal oxidation, a larger amount of deposition gas is introduced into a furnace than in the case of conventional LP-CVD. Therefore, a film thickness is less dependent on a pattern density than in the case of LP-CVD. Accordingly, even if a pattern density of deep trench TR varies depending on the product, a variation in thickness of first silicon oxide film OX1 formed in deep trench TR is reduced. Further, thermal oxidation, which allows good coatability of a silicon oxide film, is also suitable for formation of first silicon oxide film OX1 at the bottom portion of deep trench TR.

Further, in the present embodiment, after the formation of first silicon oxide film OX1, second silicon oxide film OX2 is formed using at least one of atmospheric pressure CVD and plasma CVD so that second silicon oxide film OX2 covers first silicon oxide film OX1 in deep trench TR. In each of atmospheric pressure CVD and plasma CVD, a relatively large amount of deposition gas is introduced into a deposition chamber compared to LP-CVD. Accordingly, in each of atmospheric pressure CVD and plasma CVD, a film thickness is less dependent on a pattern density than in LP-CVD.

However, atmospheric pressure CVD and plasma CVD are each inferior to thermal oxidation in coatability. Hence, if a silicon oxide film formed by atmospheric pressure CVD and plasma CVD is used alone, a sufficient insulating film that has a satisfactory dielectric strength voltage may not be formed at the bottom portion of a trench. This tendency is more remarkable for trench TR that is very deep.

As described above, a combination of first silicon oxide film OX1 formed by thermal oxidation and second silicon oxide film OX2 formed by at least one of atmospheric pressure CVD and plasma CVD allows formation of a silicon oxide film in deep trench TR whose thickness is less dependent on a pattern density and that has good coatability. This can achieve stable insulating properties and good contact between semiconductor substrate SB and buried conductive layer BD.

The use of thermal oxidation can also bring about the following advantageous effects.

Since a silicon oxide film formed by thermal oxidation is excellent in electrically dielectric strength voltage in general, a thinner silicon oxide film formed by thermal oxidation can achieve a dielectric strength voltage equal to that of a silicon oxide film formed by other methods. A thinner silicon oxide film can thus be achieved, which advantageously provides good burying properties of buried conductive layer BD buried in deep trench TR.

Further, the corner of semiconductor substrate SB at the upper end of deep trench TR can be rounded to form a round-shaped corner portion by thermal oxidation. This can also prevent deterioration in insulating properties due to charge concentration at the upper end of deep trench TR.

Since trench TR is formed to be deep, formation of trench TR requires long-time etching. If a photoresist is used for etching for forming deep trench TR, the photoresist would be consumed completely or be deformed during the long-time etching.

In contrast, in the present embodiment, surface MS of semiconductor substrate SB is treated with etching while insulating film MI which has opening MIa is used as a hard mask as shown in FIG. 6. This allows accurate formation of deep trench TR.

Further, as shown in FIG. 8, second silicon oxide film OX2 is formed so that it covers the surface of insulating film MI, that it covers the sidewalls of insulating films MI and IL1 in opening MIa, and that it covers first silicon oxide film OX1 in deep trench TR. Second silicon oxide film OX2 thus covers a portion between first silicon oxide film OX1 and insulating film IL1. This can maintain good insulation between buried conductive layer BD buried in deep trench TR and semiconductor substrate SB.

Further, as shown in FIGS. 8 and 9, anisotropic etching is performed after second silicon oxide film OX2 is formed. This process removes second silicon oxide film OX2 and first silicon oxide film OX1 at the bottom portion of deep trench TR so that a sub-region of substrate region SR is exposed. The process leaves first and second silicon oxide films OX1 and OX2 remaining on the sidewall of deep trench TR. The process also leaves second silicon oxide film OX2 remaining on the sidewalls of insulating films MI and IL1 in opening MIa. In this way, first and second silicon oxide films OX1 and OX2 in the form of a sidewall can be produced without photolithography. Therefore, manufacturing process can be simplified.

Further, as shown in FIG. 10, an impurity of a first conductivity type (p-type) is introduced in a sub-region of substrate region SR. Thus, an impurity region IR that has a higher p-type impurity concentration than substrate region SR is formed at the sub-region. In this way, an impurity can be introduced into semiconductor substrate SB through an opening in first and second silicon oxide films OX1 and OX2.

Further, as shown in FIG. 12, buried conductive layer BD is in contact with impurity region IR, thereby being electrically connected to substrate region SR with impurity region IR lying between buried conductive layer BD and substrate region SR. Since impurity region IR has a higher p-type impurity concentration than substrate region SR, a contact resistance between buried conductive layer BD and impurity region IR can be reduced.

As shown in FIG. 3, deep trench TR is formed so as to have depth D of more than or equal to 3 µm. Further, deep trench TR is formed so that the aspect ratio of deep trench TR, which is the ratio (D/W) of depth D to width W of deep trench TR, is more than or equal to 8. Even for deep trench TR having such a depth and such an aspect ratio, the technique of this embodiment allows formation of a silicon oxide film having good coatability. This can achieve stable insulating properties and good contact between semiconductor substrate SB and buried conductive layer BD.

In the present embodiment described above, buried conductive layer BD is described as a layer buried in deep Although the present invention made by the inventor has been described in detail based on an embodiment, it is needless to say that the invention should not be limited to the embodiment and that various modification may be made without departing from the gist of the invention.

What is claimed is:

1. A method for manufacturing a semiconductor device, the method comprising:
   preparing a semiconductor substrate made of a material containing silicon, the semiconductor substrate including a substrate region of a first conductivity type and an epitaxial region of a second conductivity type, the epitaxial region being located on the substrate region;
   forming a trench in a surface of the semiconductor substrate, the trench extending through the epitaxial region to the substrate region;
   forming a first silicon oxide film on an inner wall of the trench by oxidizing the inner wall of the trench while heating the inner wall of the trench;
   forming a second silicon oxide film using at least one of atmospheric pressure CVD and plasma CVD so that the second silicon oxide film covers the first silicon oxide film in the trench; and
   forming a buried layer so that the buried layer is buried in the trench,
   wherein the method further comprises forming an insulating film on the surface of the semiconductor substrate, the insulating film having an opening extending to the semiconductor substrate,
   wherein the trench is formed below the opening by etching the semiconductor substrate using the insulating film as a mask,
   wherein the second silicon oxide film is formed so as to cover a surface of the insulating film, to cover a sidewall of the insulating film in the opening, and to cover the first silicon oxide film in the trench, and
   wherein the method further comprises performing anisotropic etching after forming the second silicon oxide film, so that the second silicon oxide film and the first silicon oxide film at a bottom portion of the trench are removed for a sub-region of the substrate region to be exposed, the first silicon oxide film and the second silicon oxide film remain on a sidewall of the trench, and the second silicon oxide film remains on the sidewall of the insulating film in the opening.

2. The method for manufacturing a semiconductor device according to claim 1, the method further comprising introducing an impurity of the first conductivity type in the sub-region of the substrate region to form an impurity region at the sub-region, the impurity region having a higher concentration of the impurity of the first conductivity type than the substrate region.

3. The method for manufacturing a semiconductor device according to claim 2, wherein the buried layer is a conductive layer and is in contact with the impurity region to be electrically connected to the substrate region with the impurity region lying between the buried layer and the substrate region.

4. The method for manufacturing a semiconductor device according to claim 1, wherein the trench is formed so as to have a depth of more than or equal to 3 µm.

5. The method for manufacturing a semiconductor device according to claim 1, wherein the trench is formed so as to have an aspect ratio of more than or equal to 8, the aspect ratio being a ratio of a depth to a width of the trench.

* * * * *